US008461949B2

(12) United States Patent
Knospe

(10) Patent No.: US 8,461,949 B2
(45) Date of Patent: Jun. 11, 2013

(54) CAPILLARY FORCE ACTUATOR DEVICE AND RELATED METHOD OF APPLICATIONS

(75) Inventor: Carl R. Knospe, Charlottesville, VA (US)

(73) Assignee: University of Virginia Patent Foundation, Charlottesville, VA (US)

(*) Notice: Subject to any disclaimer, the term of this patent is extended or adjusted under 35 U.S.C. 154(b) by 0 days.

(21) Appl. No.: 13/471,399

(22) Filed: May 14, 2012

(65) Prior Publication Data

US 2012/0235538 A1  Sep. 20, 2012

Related U.S. Application Data

(62) Division of application No. 12/302,981, filed as application No. PCT/US2007/013366 on Jun. 6, 2007, now Pat. No. 8,179,216.

(60) Provisional application No. 60/811,169, filed on Jun. 6, 2006.

(51) Int. Cl.
*H01H 51/22* (2006.01)

(52) U.S. Cl.
USPC ............................................ 335/78; 200/181

(58) Field of Classification Search
USPC ................................ 335/78, 47–58; 200/181
See application file for complete search history.

(56) References Cited

U.S. PATENT DOCUMENTS

| | | | | |
|---|---|---|---|---|
| 6,927,350 B2* | 8/2005 | Kondoh et al. | | 200/182 |
| 7,548,009 B2* | 6/2009 | Hsiao | | 310/300 |
| 7,595,925 B2* | 9/2009 | Valette et al. | | 359/290 |
| 7,733,549 B2* | 6/2010 | Sugahara | | 359/223.1 |
| 2006/0108209 A1* | 5/2006 | Beerling | | 200/182 |
| 2010/0000866 A1* | 1/2010 | Roux et al. | | 204/602 |
| 2011/0147215 A1* | 6/2011 | Fuchs et al. | | 204/450 |
| 2011/0180571 A1* | 7/2011 | Srinivasan et al. | | 222/420 |

* cited by examiner

*Primary Examiner* — Bernard Rojas
(74) *Attorney, Agent, or Firm* — Robert J. Decker

(57) ABSTRACT

An actuator capable of generates force by leveraging the changes in capillary pressure and surface tension that result from the application of an electrical potential. The device, which will be referred to as a Capillary Force Actuator (CFA), and related methods, employs a conducting liquid bridge between two (or more) surfaces, at least one of which contains dielectric-covered electrodes, and operates according to the principles of electrowetting on dielectric.

27 Claims, 12 Drawing Sheets

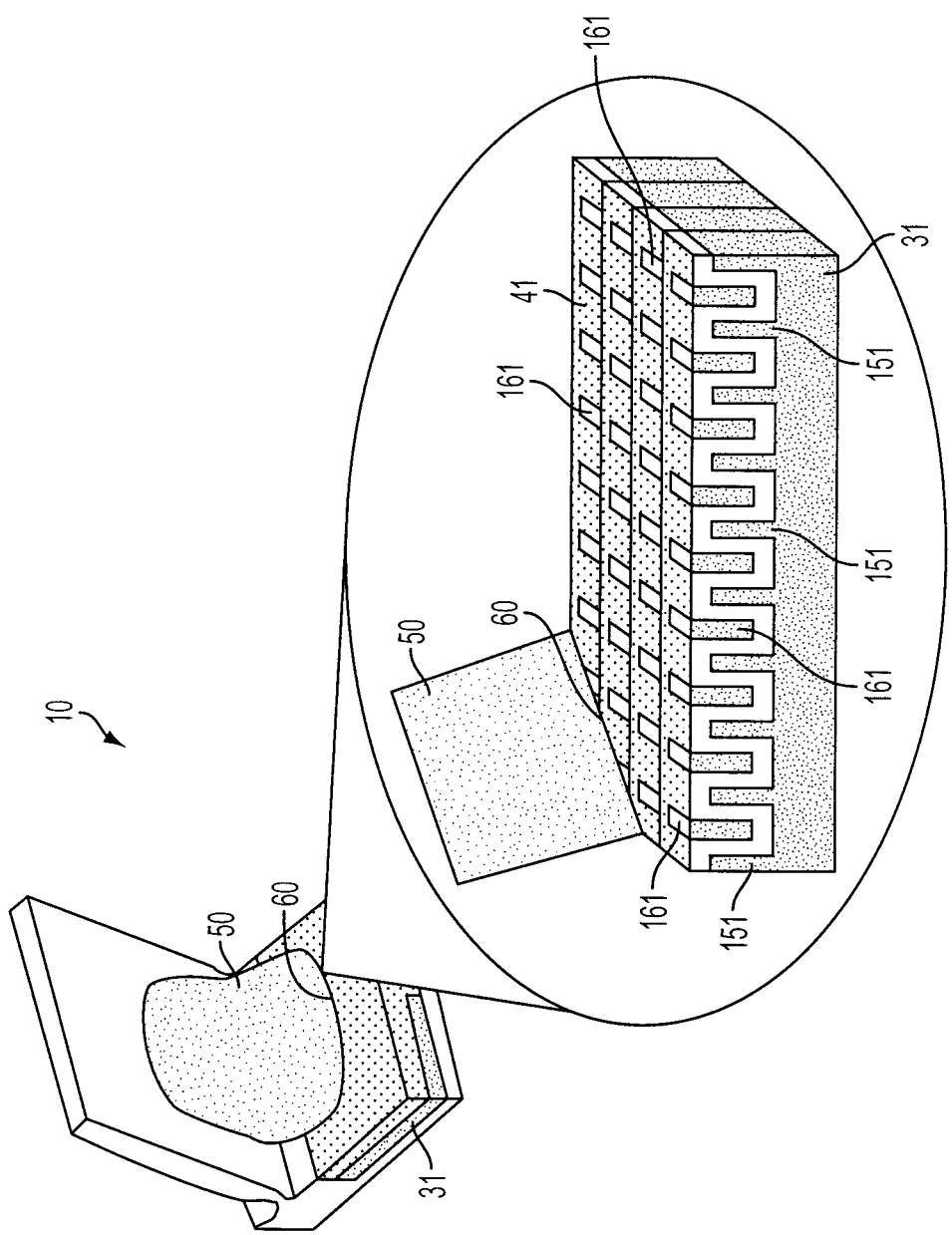

CAPILLARY FORCE ACTUATOR DEVICE AND RELATED METHOD OF APPLICATIONS

RELATED APPLICATIONS

The present application claims priority under 35 U.S.C. §120 as a divisional application of U.S. application Ser. No. 12/302,981, filed Dec. 1, 2008, which is a national stage filing of International Application No. PCT/US2007/013366, filed Jun. 6, 2007, which claims benefit of priority under 35 U.S.C. §119(e) from U.S. Provisional. Application Ser. No. 60/811, 169 filed Jun. 6, 2006, entitled "Method and System for Capillary Force Actuators," of which the disclosures are hereby incorporated by reference herein in their entirety.

FIELD OF THE INVENTION

The present invention relates to the field of actuators used to create force or pressure in systems like micro-electromechanical systems (MEMS). More specifically, the present invention relates to an actuator that is driven by induced changes in the capillary pressure of a liquid through the application of an electrical potential.

BACKGROUND OF THE INVENTION

For micro-electromechanical systems (MEMS) and bio-MEMS (e.g., micro total analysis systems, or μTAS), a variety of force actuation methods have been used to either move structures or to induce stress in stationary structures, including electromagnetic, electrostatic, pneumatic, thermal, piezoelectric, magnetostrictive, among others. Each of these actuation technologies has advantages, disadvantages, and tradeoffs in terms of performance metrics such as force capability, total displacement (stroke), actuation bandwidth, ease of integration to particular applications, and manufacturability.

Electrostatic actuation is the most commonly employed technology in commercial applications that require actuation forces produced within the lateral plane of the lithographically fabricated device, though some are employed to tilt objects about a pivot in some applications, notably mirrors in Texas Instruments' Digital Light Processor chip [TI 2006]. Conventional electrostatic actuators rely on the property that a virtual displacement of one electrode towards another generates a decrease in overall energy. The energy change is achieved through a decrease in the thickness of the dielectric (air). One problem with this type of actuator is that the actuation stroke depends on the thickness of the dielectric (the air gap) while actuation force is dependent on it inversely. Thus, large forces and large strokes cannot be simultaneously achieved.

In MEMS electrostatic actuators, a decoupling of actuator stroke from dielectric thickness has been achieved by using a comb arrangement as disclosed in inventions like Rodgers, et al., U.S. Pat. No. 6,133,670, hereby incorporated by reference. In comb actuators, an air gap serves as the dielectric and its thickness is the gap between comb teeth (typically 1 micron or greater). But this arrangement suffers from limitations of its own. As the force produced by electrostatic comb actuators is increased by decreasing comb teeth spacing or increasing the length of the teeth, the device becomes prone to side instability (i.e., instability perpendicular to comb teeth and desired stroke). In addition, practical limits of lithography also limit the teeth spacing and hence, force capability.

The actuators in Wapner & Hoffman, U.S. Pat No. 6,152, 181, hereby incorporated by reference, rely on changes in the shape and position of liquid droplets in response to external stimuli to operate pumps, valves and other mechanical devices like sensors. These devices take advantage of changes in surface tension and capillary pressure to actuate. They rely on the principle of electrowetting which refers to the change in wetting behavior of a liquid when an electric potential is applied [Shapiro, 2003].

Other actuation methods in the prior art illustrate that the wetting effect can be enhanced by the use of a dielectric layer, see [Moon 2002, Shapiro 2003] as a reference. Electrowetting has been investigated for the movement of fluid droplets in μTAS [Pollack 2002] or integrated circuit cooling systems, for altering the shape of a liquid lens or liquid mirror, and in optical devices [Jackel 1983]. In these applications, electrowetting is employed for the translational motion of a fluid drop across a surface, or for the distortion of drop shape so as to affect the drop's optical properties. In droplet transport, an imbalance in surface tension forces induces droplet motion; motion is not caused by a change in capillary pressure. A number of patents on these applications exist. Electrowetting has also been used to move a solid mirror floating on top a liquid metal drop by distorting the drop's shape via increased wetting of the drop on a flat supporting substrate; the mirror in this case moves normal to the supporting substrate [Wan 2006]. With the application of voltage, the mirror moves to a new equilibrium position where the total force exerted by the drop upon the mirror is unchanged from the value achieved with no applied voltage. (In equilibrium, the drop force must equal the gravitational force acting upon the mirror which is unchanged.)

A main problem with the prior art uses of electrowetting for actuation is, but not limited thereto, that it is of limited application. Specifically, it is limited to applications that rely only on the change in shape or the change in position of the liquid. These systems depend on gravity (in the case of the floating mirror) or the physical structure of the surrounding system, in the case of sensors and valves, to enable actuation after the liquid responds to the applied potential.

The prior art fails to provide a means to produce and sustain significant force or pressure with continuous applied voltage. Furthermore, capillary pressures achieved in the prior art are, by necessity, greater than ambient pressure. The prior art fails to leverage the fact that at small scale (for example, less than 1 millimeter), the forces of capillary pressure and surface tension can be very large, making this actuation scheme particularly appealing for micro-electromechanical systems (MEMs) and bio-MEMS, as well as for larger mesoscale (for example, approximately 1 mm) devices. By combining together many such small capillary force actuators, powerful meso- and macroscale actuators can, in principle, also be developed.

There is a need to provide an actuator that is capable of optimizing the various performance metrics of actuators for improved performance in existing systems and for the facilitation of new actuation-based systems currently unavailable due to the limitations in the prior art. Notably, there is a need for actuators that provide increased force capabilities at reduced voltage levels. There is also a need for out-of-plane forces in relation to the substrate in lab-on-a-chip, and other MEMS (i.e. force creation in a direction other than parallel to the surface) without sacrificing stability, force capability, or actuator stroke, and for greater stability and wear-resistance in actuators that are currently employed in mechanical systems.

SUMMARY OF THE INVENTION

An aspect of various embodiments of the present invention device and methods, which will be referred to as a Capillary Force Actuator (CFA), employs a conducting liquid bridge between two (or more) surfaces, at least one of which contains dielectric-covered electrodes. An electrical potential is applied across the electrodes. The capillary force acting upon the surfaces is modified by the applied potential. The force produced by the electrical potential acts in addition to any surface tension or (perhaps repulsive) capillary forces produced by the liquid bridge in absence of the electrical potential. This design enables the force creation of a traditional electrostatic actuator to be dramatically increased by the forces enabled by electrowetting-on-dielectric. An aspect of the various embodiments of the present invention provides, among other things, a new means to apply forces to stationary structures, to flexible elements such as membranes, to flexibly-supported elements, or to freestanding bodies.

An aspect of an embodiment of the present invention provides a capillary force-actuator. The capillary force-actuator comprising: a first substrate; an electrode layer disposed on the first substrate; a dielectric layer disposed on the electrode layer on the side farthest from the first substrate; and a conducting liquid in communication with the dielectric layer. And whereby the capillary pressure within the liquid is reduced by the application of an electric potential and is below ambient pressure with the application of sufficient electrical potential thereby exerting a pulling force on the first substrate when the actuator is in communication with a surface of a system.

An aspect of an embodiment of the present invention provides a capillary force-actuator. The capillary force-actuator comprising: a first substrate; an electrode layer disposed on the first substrate; a dielectric layer disposed on the electrode layer on the side farthest from the first substrate; a second substrate; and a conducting liquid in communication with the dielectric layer of the first substrate and the second substrate. And whereby the capillary pressure within the liquid is reduced by the application of an electric potential and is below ambient pressure with the application of sufficient electrical potential thereby exerting a pulling force on the first and second substrates.

An aspect of an embodiment of the present invention provides a method of force actuating. The method comprising: providing a the first substrate; providing an electrode layer disposed on the first substrate; providing a dielectric layer disposed on the electrode layer on the side farthest from the first substrate; providing a conducting liquid in communication with the dielectric layer of the first substrate; integrating the first substrate and the conducting liquid into a system, wherein the conducting liquid is in communication with the surface of the system, and applying an electric potential to reduce the capillary pressure within the conducting liquid with the application of sufficient electrical potential that exerts a pulling force on the first substrate thereby reducing the distance between the first substrate and the surface of the system.

An aspect of an embodiment of the present invention provides a method of force actuating. The method comprising: providing a the first substrate; providing an electrode layer disposed on the first substrate; providing a dielectric layer disposed on the electrode layer on the side farthest from the first substrate; providing a the second substrate; providing a conducting liquid in communication with the dielectric layer of the first substrate and the second substrate; and applying an electric potential to reduce the capillary pressure within the conducting liquid with the application of sufficient electrical potential that exerts a pulling force on the first and second substrates thereby reducing the distance between the first substrate and the second substrate to provide actuation.

An aspect of an embodiment of the present invention provides a method of capillary actuating. The method comprising: providing a the first substrate; providing an electrode layer disposed on the first substrate; providing a dielectric layer disposed on the electrode layer on the side farthest from the first substrate; providing a the second substrate; providing an electrode layer disposed on the second substrate; providing a dielectric layer disposed on the electrode layer on the side farthest from the second substrate; providing a conducting liquid in communication with the dielectric layer of the first substrate and the dielectric layer of the second substrate; and applying an electric potential to reduce the capillary pressure within the conducting liquid with the application of sufficient electrical potential that exerts a pulling force on the first and second substrates thereby reducing the distance between the first substrate and the second substrate to provide actuation.

The invention itself, together with the further objects and attendant advantages, will best be understood by reference to the following detailed description taken in conjunction with accompanying drawings.

BRIEF DESCRIPTION OF THE DRAWINGS

The foregoing and other objects, features and advantages of the present invention, as well as the invention itself, will be more fully understood from the following description of preferred embodiments, when read together with the accompanying drawings, in which:

FIGS. 7 (A)-(B) provide schematic illustrations of an active surface with "folded" dielectric layer. FIG. 7(B) represents a more detailed view of the dielectric layer.

DETAILED DESCRIPTION OF THE INVENTION

A Capillary Force Actuator (CFA) consists of at least two surfaces with a conducting liquid bridge spanning the gap between them, this bridge surrounded by an insulating non-working fluid, either liquid or gas. At least one of these surfaces contains one or more electrodes covered with a thin layer of solid dielectric material. The same or another surface contains another electrode, which may or may not be covered with a dielectric material. When an electrical potential is applied across the electrodes, the phenomenon of electrowetting occurs, especially on the dielectric-covered surface, where the contact angle of the liquid on the surface is reduced. The decrease in contact angle on the surfaces results in a change in the shape of the liquid bridge and hence in its capillary pressure. A net force is then generated by both the capillary pressure acting on the surfaces and by the surface tension forces acting at the contact line, the former typically being the predominant contributor. While electrowetting occurs in the device described herein and the operation of the device may be explained in terms of this phenomenon, the principle of actuation is broader than this; the principle of operation is that of a deformable conductor in contact with dielectric-covered surfaces, with the contact area dependent on the separation between surfaces. According to the concept of virtual work, such a device will produce a force even when electrowetting (i.e., a change in contact angle with applied voltage) does not occur. The forces created by the liquid bridge may be altered and controlled by application of a voltage difference, either DC or AC, across the electrodes Several possible configurations of the actuator are described here and shown in the Figures. In its simplest form, a CFA consists of two conducting planar solid surfaces (electrodes) parallel to one another, with at least one covered by a thin insulating solid dielectric layer, and with the gap between containing an incompressible liquid bridge surrounded by a less-conductive non-working fluid, either liquid or gas. The liquid bridge is significantly more conducting than either the dielectric layer or the non-working fluid. A voltage difference may be applied to the electrodes so as to apply a strong electric field to the area of the solid dielectric layer(s) that is wetted by the bridge. The force that is exerted by the bridge on the electrodes is significantly altered by the application of this electric potential and is due to changes in both the liquid's capillary pressure and surface tension forces, with the first of these typically being significantly greater.

Figure 1A:
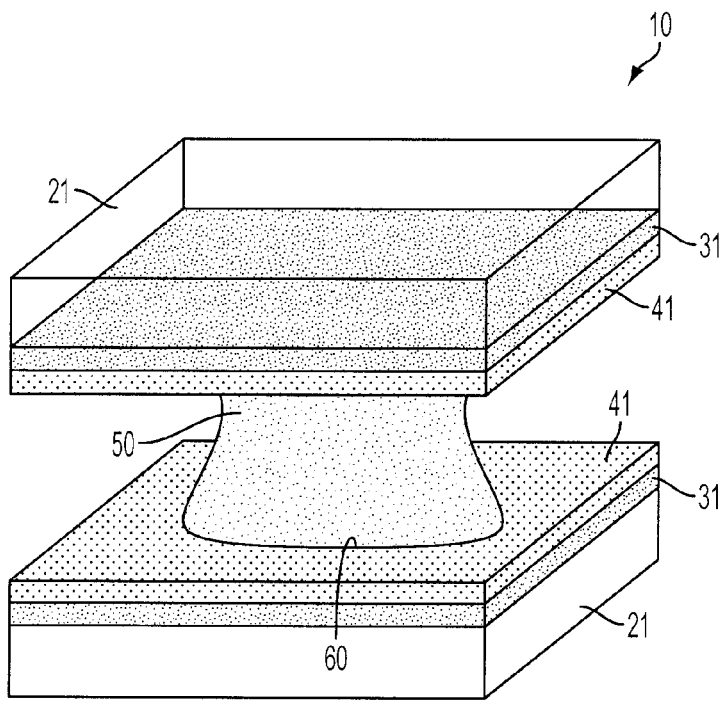
FIGS. 1(A)-(B) provide schematic perspective and elevation views, respectively, of a Capillary Force Actuator consisting of two parallel surfaces with a conducting liquid bridge. Each surface contains an electrode covered with a dielectric layer of high permittivity.
Figure 1B:
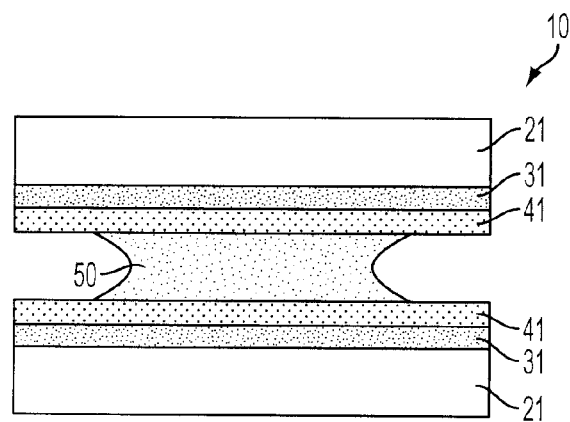
Figure 2A:
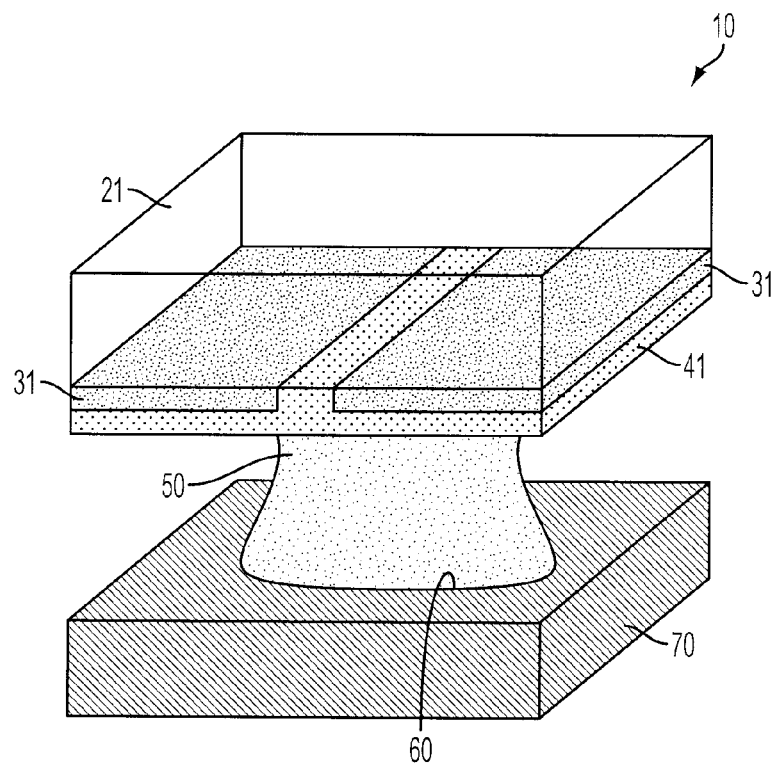
FIGS. 2(A)-(B) provide schematic perspective and elevation views, respectively, of Capillary Force Actuator consisting of two parallel surfaces with a conducting liquid bridge. One surface is passive and the opposing surface contains two electrodes, each covered by a dielectric layer of high permittivity. The passive surface may have topological features or chemical heterogeneity so as to affect the shape of the contact line and/or its motion.
Figure 2B:
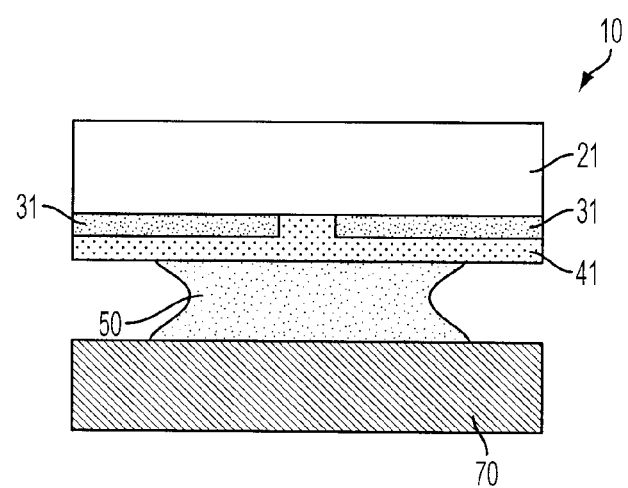

Turning now to the drawings, an embodiment of the subject invention shown in FIGS. 1-2, contains an electrode layer 31 on at least one substrate 21. A solid dielectric layer 41 covers the electrode layer 31 on the side of the substrate in communication with the liquid bridge 50. It may be noted an actuator could be built such that it leverages the surface of the system in which it is incorporated. In such a scenario, the invention would take the form of a single substrate, containing electrodes and covered with a thin insulating dielectric layer. In this set-up, the liquid bridge would separate this substrate from the surrounding system which would in effect provide the second substrate as illustrated in the figures. Various external systems include, but are not limited to, the incorporation of the single-substrate embodiment in lab-on-a-chip, sensors, motors, accelerometers, valves and various other dynamic systems known to the world of MEMS that provide a surface in communication with the liquid bridge.

Two Parallel Surfaces: In an embodiment, shown in FIG. 1, the actuator 10 consists of two bodies with parallel surfaces, each consisting of a substrate 21 covered by electrodes 31, one or both of which are covered by a solid, thin insulating layer 41 of high dielectric constant ("dielectric layer"). A conducting liquid bridge 50 spans between the two surfaces, contacting the dielectric layers, or if one electrode is not insulated, the electrode itself. The forces created by the liquid bridge may be altered and controlled by application of a voltage difference across the electrodes, this force acting perpendicular to the parallel surfaces.

Figure 3A:
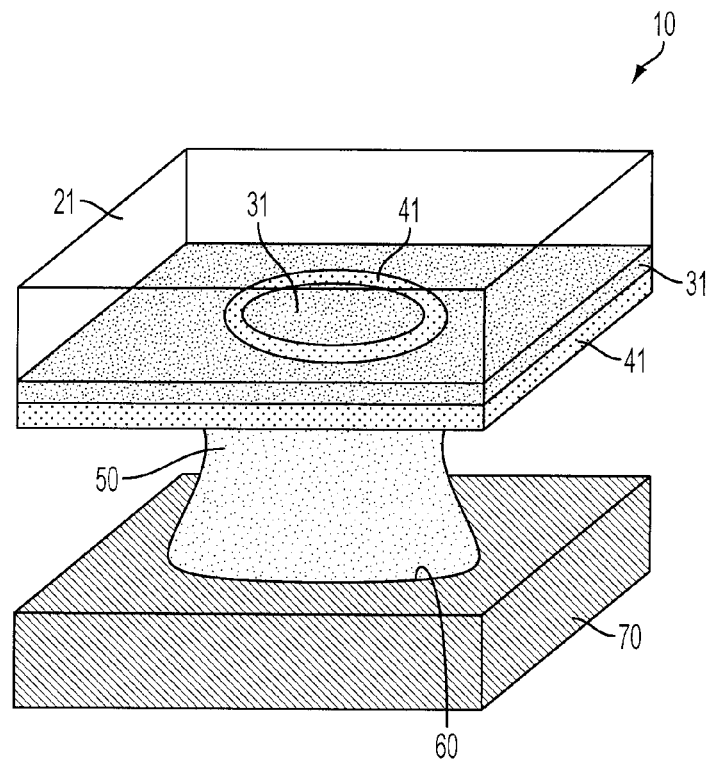
FIGS. 3(A)-(B) provide schematic perspective and elevation views, respectively, of a Capillary Force Actuator similar to that in FIG. 2, but with an alternate arrangement of electrodes. Many variations on electrode arrangement are possible.
Figure 3B:
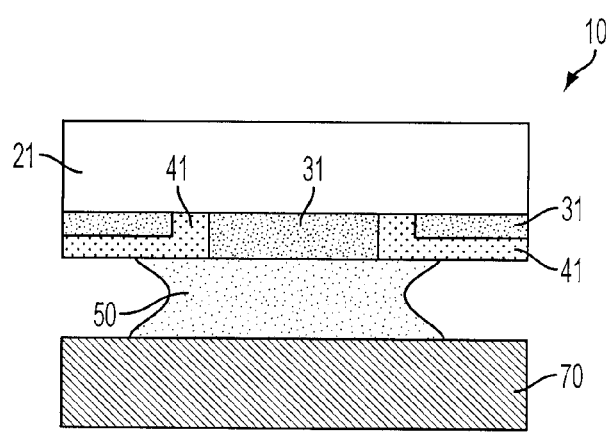

Parallel Surfaces with One Active Surface: In an embodiment, shown in FIGS. 2 and 3, the actuator 10 consists of two bodies with parallel surfaces with a conducting liquid bridge 50 spanning between them. One body consists of a substrate 21 covered by two or more electrodes 31 ("active surface"), at least one of which is covered by a thin dielectric layer 41. The other surface 70 does not contain an electrode ("passive surface"). The contact line 60 of the liquid bridge crosses the surface(s) of the dielectric layer 41 and may advance across it when either the applied voltage or the distance between surfaces changes. The forces created act perpendicular to the parallel surfaces. The liquid contact line on the passive surface 70 may be pinned or its behavior modified by surface topography or chemical heterogeneity so as to enhance performance of the device. The contact line's behavior may be similarly affected on part, but not all, of the active surface. FIG. 2 shows one example of this configuration, where the electrodes 31 are rectangular, insulated, and neighboring. FIG. 3 shows an embodiment where the electrodes 31 are circularly symmetric with the central electrode 31 not covered by a dielectric layer.

Figure 12:
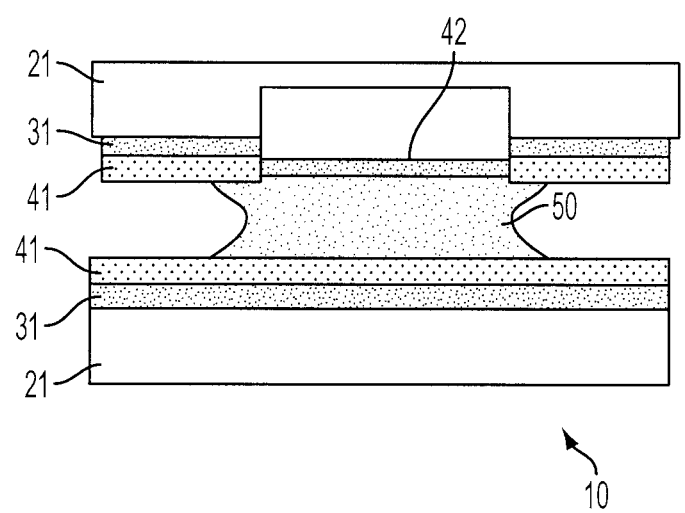
FIG. 12 provides a schematic of a Capillary Force Actuator that comprises two parallel surfaces, each containing an electrode covered with a dielectric layer, and a flexible surface that deforms with changing capillary pressure.

Parallel Surfaces with Additional Flexible Surface: In an embodiment, shown in FIG. 12, the actuator 10 consists of two bodies with parallel surfaces, each consisting of a substrate 21 covered by electrodes 31, one or both of which are covered by a solid, thin insulating layer 41 of high dielectric constant ("dielectric layer"). A conducting liquid bridge 50 spans between the two surfaces, contacting the dielectric layers, or if one electrode is not insulated, the electrode itself. The conducting liquid bridge also contacts a flexible surface 42. The flexible surface may be, but is not limited to, a plate, diaphragm, or membrane. A flexible surface, plate, diaphragm membrane, or other suitable surface and structure, for example but not limited thereto, may be a substrate, such as a third substrate in this particular figure or approach. The pressure created by the liquid bridge acting on the flexible surface may be altered and controlled by application of a voltage difference across the electrodes. The pressure acts to cause deformation of the flexible surface. Such an embodiment may be particularly useful in valves and pumps for lab-on-a-chip applications.

Figure 4:
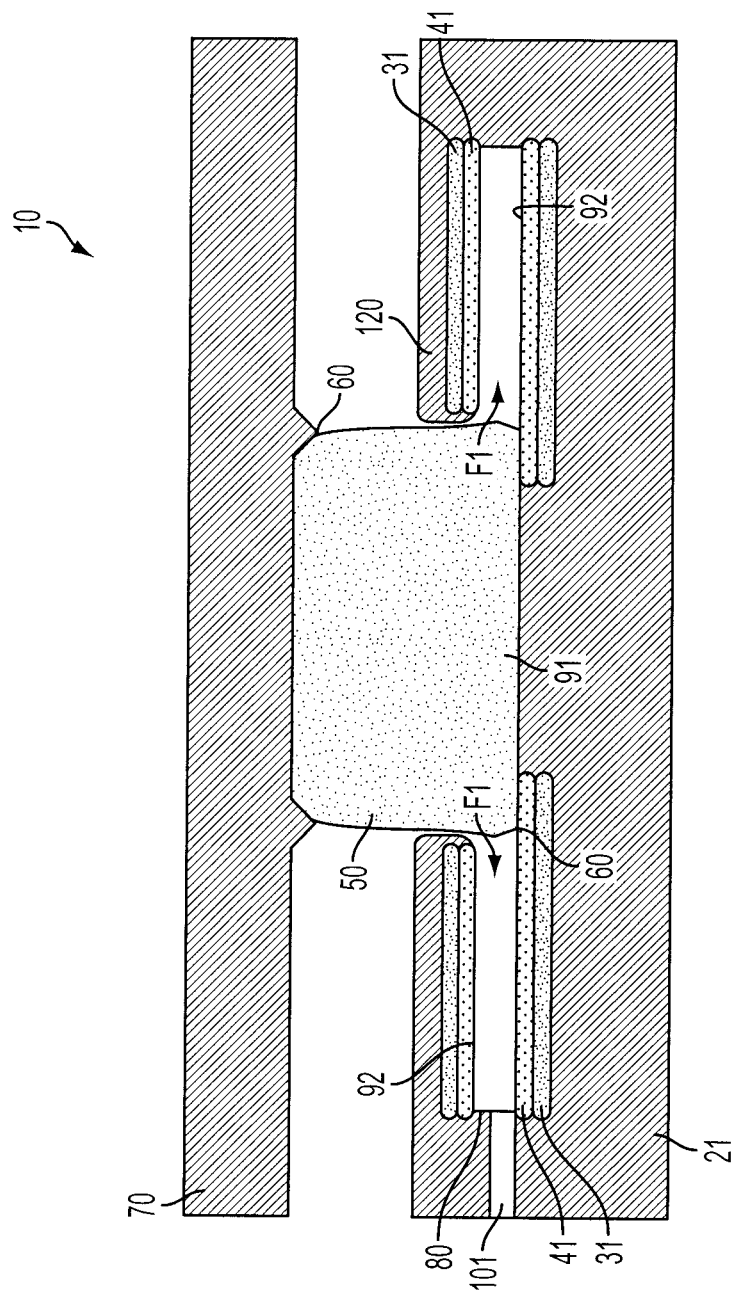
FIG. 4 provides a schematic of Capillary Force Actuator consisting of two parallel surfaces with a conducting liquid bridge. One surface is passive and the opposing surface contains a cavity into which the liquid bridge may enter. The cavity contains electrodes, each covered by a dielectric layer of high permittivity.
Figure 5:
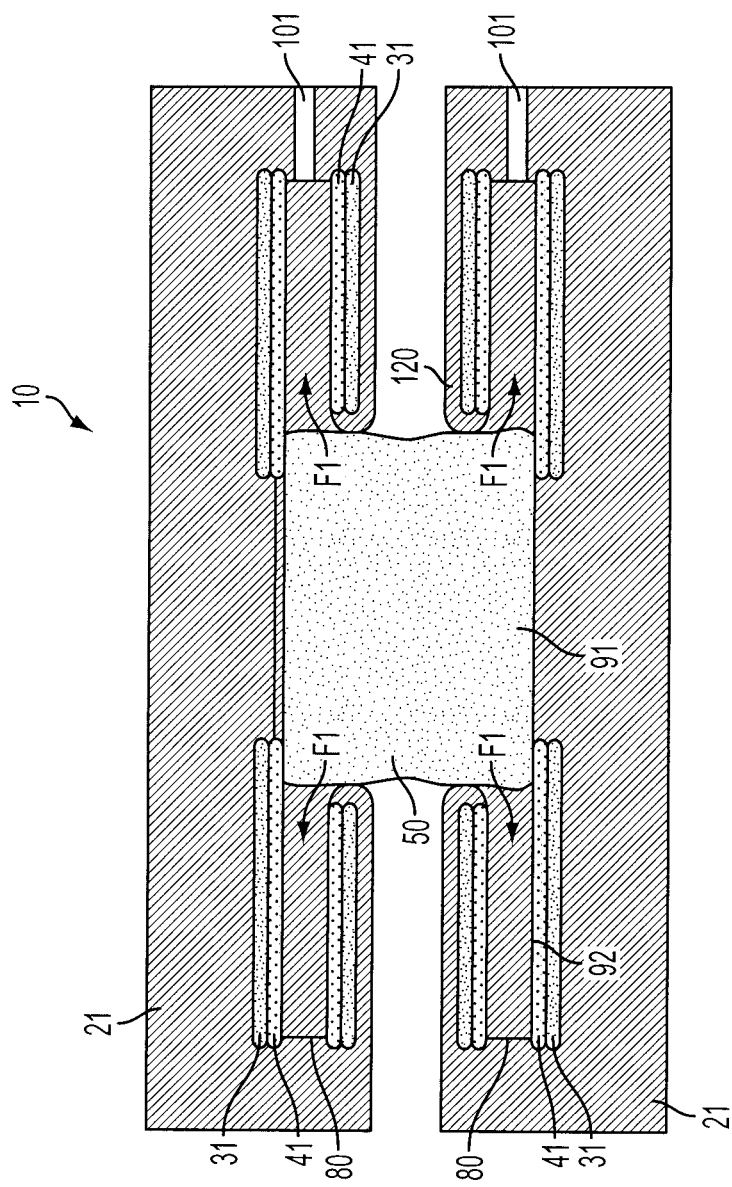
FIG. 5 provides a schematic of a Capillary Force Actuator consisting of two parallel surfaces with a conducting liquid bridge. Each surface possesses a cavity into which the liquid bridge may enter. The cavity contains electrodes, each covered by a dielectric layer of high permittivity.

Parallel Surfaces with Active Surfaces in a Cavity: In the embodiments shown in FIGS. 4 and 5, the actuator 10 consists of two bodies with parallel surfaces, one or both of which contain a cavity 80 into which the liquid bridge 50 enters (as illustrated by the arrows F1 in FIG. 4). The interior surfaces of the cavity contain electrodes 31 of both polarities, some or all of which are covered with a thin dielectric layer 41. The contact line of the liquid 60 crosses these surface(s) of the dielectric-covered electrode(s) and may advance across it. Certain interior surfaces 91 of the cavity are lyophillic so that the liquid bridge does not entirely evacuate the cavity when no voltage is applied and the remainder of the interior surfaces 92 are lyophobic so that the force may be controlled via the application of voltage to the electrodes. For the purposes of the present disclosure, the term "lyophillic" refers to a surface that is preferentially wetted by the liquid employed in the capillary bridge in comparison to the non-working fluid; that is, the contact angle with such a surface is less than 90-degrees. In addition, the term "lyopobic" refers to a surface that is preferentially avoided by the liquid employed in the capillary bridge in comparison to the non-working fluid; that is, the contact angle with such a surface is greater than 90-degrees. The exterior surfaces surrounding the cavity 120 may also be lyophobic so as to prevent the bridge from spreading onto them. Cavities may have ports 101 at the cavity's periphery so as to allow the nonworking fluid (typically air) to enter/leave the cavity as the liquid bridge moves out/into the cavity. FIG. 4 shows an embodiment where one surface 70 is passive (without electrode and cavity) and the liquid bridge 50 and cavity 80 on the other body are circularly symmetric. The contact line of the bridge on the passive surface 60 may be pinned (as shown in the Figure) or the contact line's behavior may be modified by surface topography or chemical heterogeneity so as to enhance performance. Ports 101 are included at the periphery of the cavity. The forces generated by the liquid bridge act perpendicular to the parallel surfaces 70,21. FIG. 5 shows an embodiment where circularly symmetric cavities 80 are within both bodies and the liquid bridge wets into each cavity. The generated forces act perpendicular to the exterior surfaces 120.

Figure 6:
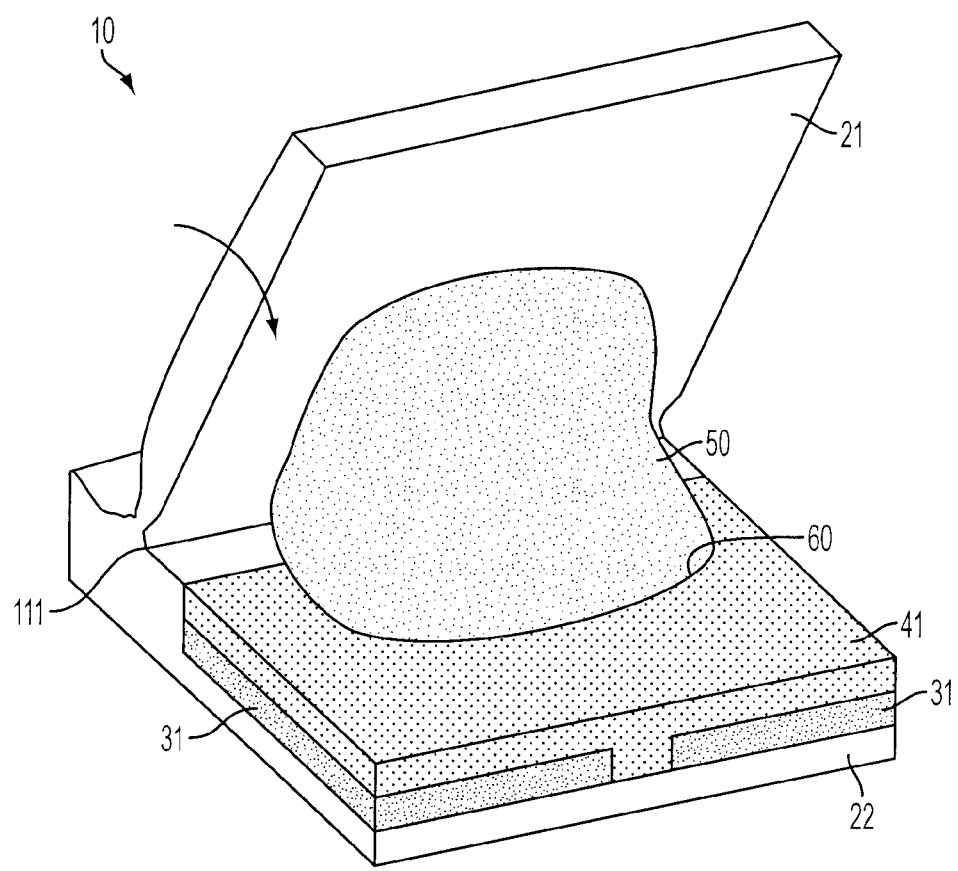
FIG. 6 provides a schematic of a Capillary Force Actuator that produces rotational motion. The actuator consists of two non-parallel surfaces with a conducting liquid bridge. One surface is passive and the opposing surface contains two electrodes, each covered by a dielectric layer of high permittivity.

Rotating Surface: In an embodiment shown in FIG. 6, the forces generated by the liquid bridge act to rotate one body with respect to another. One substrate 21 is attached by a flexure 111 to another stationary body 22 so that it may rotate in response to a changing capillary force induced by applied voltage. Electrodes 31 are within the stationary body 22 and are covered by a thin dielectric layer 41. The rotating body 21 in this configuration is without electrodes ("passive"). The liquid contact line 60 on the passive surface may be pinned or its behavior modified by surface topography or chemical heterogeneity so as to enhance performance of the device. A liquid bridge 50 of conducting fluid is between the surfaces of the two bodies, perhaps filling the interstice of their connection. The contact line of the liquid bridge 60 crosses the surface(s) of the dielectric layer and may advance on it. The forces created act to cause rotation. In other configurations of this device, the rotating and stationary surfaces may be connected by a hinge, and both the rotating and stationary surfaces may contain electrodes, some or all of which are covered with a thin dielectric layer.

Capillary Force Actuation in Combination with Electrostatic Actuation: Certain MEMS applications require both significant stroke and a very large force capability (greater than 100 µN) near one or both ends of stroke. One example is RF MEMS switches where metal-to-metal contact forces in the switch-closed position must be large enough to ensure a good electrical connection is achieved. Another example is microfluidic valves for lab-on-a-chip applications, which must be closed tightly to prevent leakage.

For very small gaps (less than 0.5 µm), electrostatic actuators can provide superior force capability to capillary force actuation without employing excessive voltages. However, electrostatic is incapable of large actuation stroke with low voltage. The use of capillary force actuation in combination with electrostatic actuation allows both significant stroke and very large force near the end of stroke to be achieved.

Figure 9:
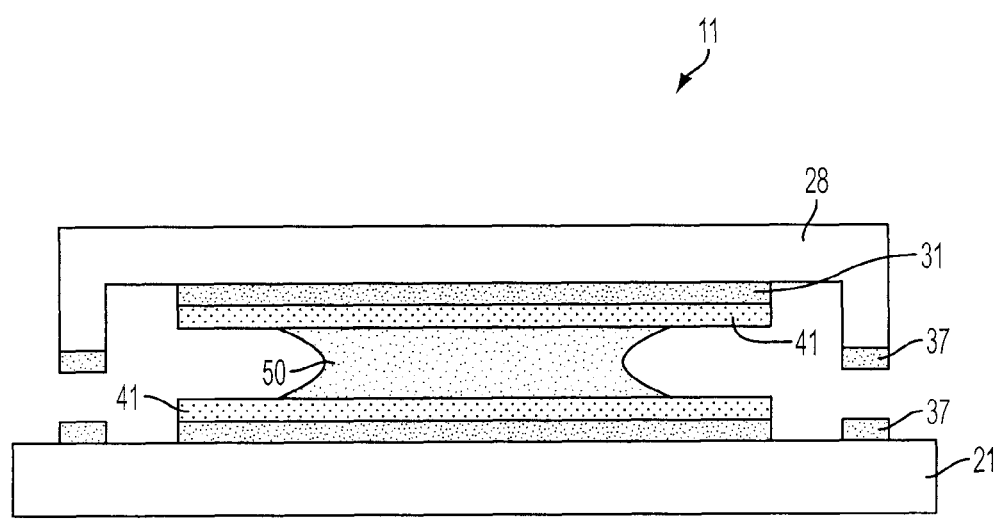
FIG. 9 provides a cross-section of a Capillary Force/Electrostatic combination actuator that comprises additional electrodes on the substrate surfaces.
Figure 10:
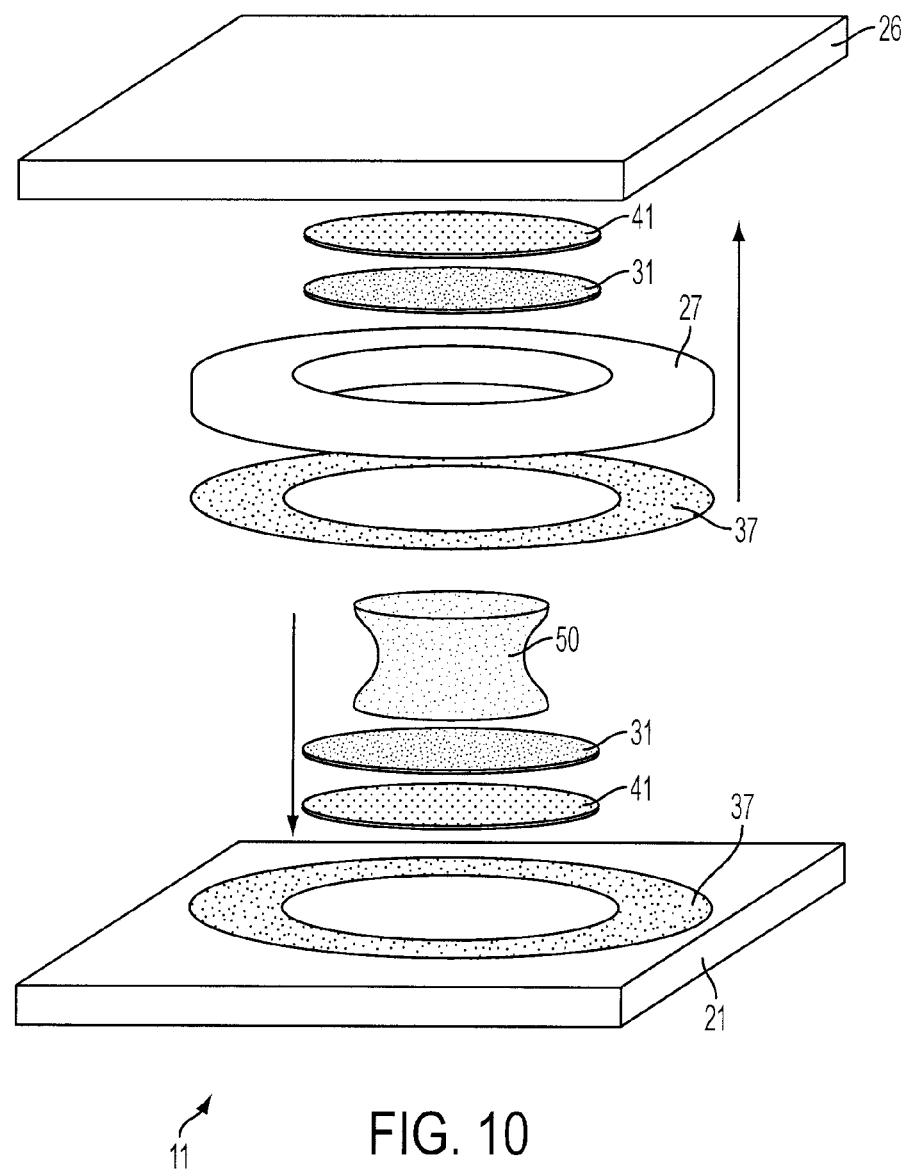
FIG. 10 provides an exploded view of a concentric embodiment of the CFA/Electrostatic combination actuator.
Figure 11:
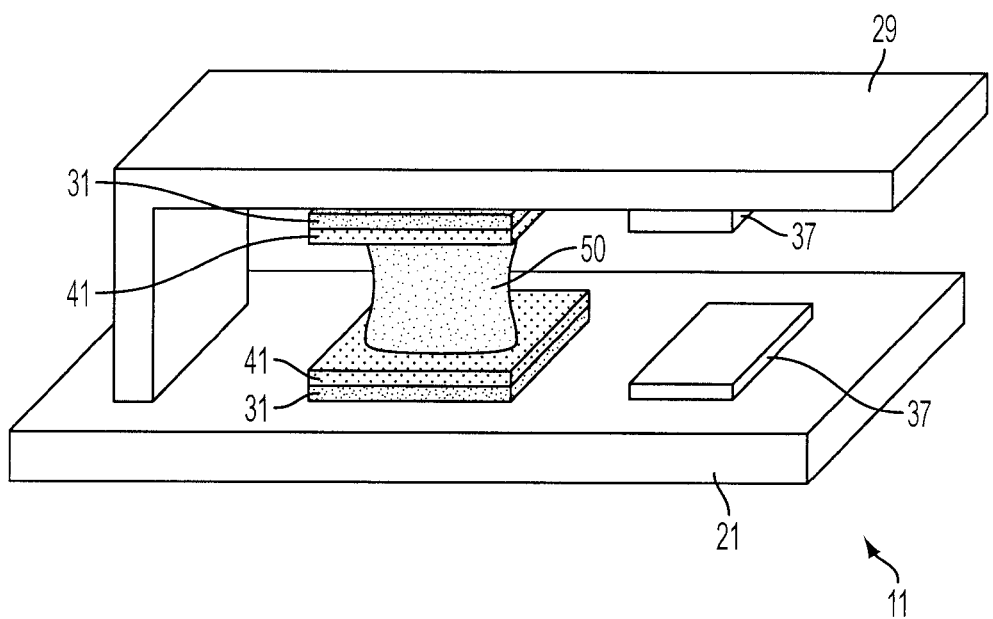
FIG. 11 provides a schematic of a CFA/Electrostatic combination actuator configured in a side-by-side arrangement.

Many configurations of this combination of actuators are possible. In general, they consist (1) a capillary force actuator (as previously discussed in multiple embodiments including but not limited to an embodiment consisting of two surfaces, with electrodes and dielectric layers arranged upon them, and a conducting capillary bridge); and (2) additional electrodes arranged on both surfaces that may be brought into close proximity of each other. The additional electrodes may or may not be in electrical communication with the electrodes of the capillary force actuator and may or may not be a continuation of them. The additional electrodes may also be covered with a thin dielectric layer to prevent current flow in an embodiment where the two surfaces are brought into physical contact. FIG. 9 shows a cross section of an embodiment of this device. In this embodiment, the combination actuator 11 contains an additional electrode 37 on each of the substrates 21,28. These additional electrodes 37 are position so that they are not in communication with the conducting liquid 50. This embodiment is circularly symmetric, meaning the electrodes 37 shown in this cross section are in the shape of an annulus. FIG. 10 shows an exploded view of a similar embodiment of the combination actuator 11 where the single substrate 28 from FIG. 9 is instead made up of a single substrate 26 in communication with a annular-shaped substrate 27. FIG. 11 shows an embodiment of a combination actuator 11 where the capillary force actuator and electrostatic actuators are side-by-side between the substrate layers 29,21 as would be preferred in an RF switch.

Although not illustrated, it should be appreciated that in addition to being disposed on the first and second substrates, the additional electrodes can be positioned in close proximity (in a proximity or distance that is desired or required) to the first and second substrates. In this configuration, the electrostatic actuator works alongside or around or remotely to the Capillary Force Actuator to achieve the desired results. In one embodiment that is useful for lab-on-a-chip devices, a Capillary Force Actuator may be used as a means to open a valve, while a surrounding electrostatic actuator could be leveraged to close the valve with greater force than would otherwise be possible with the Capillary Force Actuator alone. Electrostatic actuators are well known in the prior art, and the range of embodiments that are currently employed in MEMS, and other utilities can be leveraged in combination with the Capillary Force Actuator in numerous configurations to achieve the superior force creation when gaps are small and the large stroke distances reduced voltage and increased force when the gap distance increases. For instance, but not limited thereto, the capillary force actuator may further comprise additional electrodes and/or metal layers disposed on: the first substrate and the second substrate, and/or a third substrate in close proximity to the first substrate and the second substrate. And whereby the additional electrodes and/or metal layers are not in communication with the conducting liquid, and the additional electrodes and/or metal layers are positioned opposite each other on: the first substrate and the second substrate, and/or the third substrate.

Figure 8A:
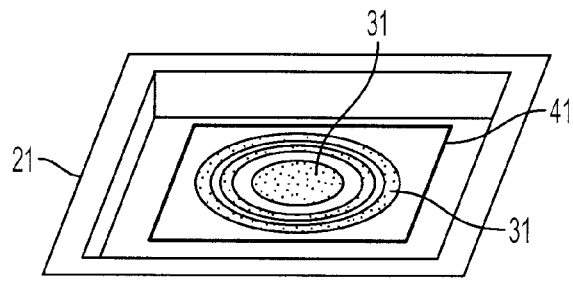
FIG. 8(A) provides a schematic elevated top-view of a cross section of Capillary Force Actuator along cross-section I-I of FIG. 8.

Flexible Supports: In an embodiment of the present invention, the actuator 10, 11 can include flexible supports to provide stability, limit the range of motion, adjust or influence the location or resistance of any of the substrates and associated components herein. The use of flexible supports is customary in the world of MEMS and the inventor fully anticipates that such support mechanism would be used in conjunction with this invention. Embodiments of the current invention may include, but are not limited to, simple, double or other flexures, cantilever beams, diaphragms, membranes, serpentine springs, leaf springs, hinges, plates, pivots, complaint joints, rotational joints, torsional hinges, folded beams, revolute joints, or translational joints for flexible supports. FIG. 8 illustrates a micromachined silicon actuator 10 and serves as an illustrative example of the use of flexible supports 181 in conjunction with the substrates of the actuator 10.

Capillary Force Actuator: An exemplary novelty of the Capillary Force Actuator (CFA) comes from, but is not limited thereto, the use of a conducting liquid bridge that partially covers a dielectric-covered electrode(s) attached to one or more surfaces, this liquid bridge acting as a deformable conductive element in the circuit, and, as such, generating force in a novel and advantageous fashion in comparison to electrostatic actuators.

The generation of forces upon the surfaces may be understood via the principle of virtual work. A virtual displacement of one surface toward the other(s) would result in spreading of the bridge onto a larger surface area of the dielectric. The conductance of the liquid results in a large electrical potential being put across the dielectric layer that is wetted, this potential being a substantial fraction of the voltage applied to the device. The energy change associated with a newly wetted area of dielectric is effectively negative due to the electrical work done upon the charge source when the voltage is maintained constant across the dielectric layer. Hence, a virtual displacement of one surface toward the other results in a decrease in total energy of the device and its charge source. The principle of virtual work implies that an attractive force is generated between the surfaces via the application of the electrical potential. This attractive force acts in addition to any surface tension and capillary forces that act between the surfaces when no voltage is applied. In essence, the liquid bridge acts as a deformable conductor (or electrode) in this device. The phenomenon of electrowetting naturally occurs in this device and the forces obtained may also be understood within the paradigm of actively changing contact angle via electrowetting. Nevertheless, according to the argument of virtual work presented, forces would be produced within an actuator of similar construction even if electrowetting did not occur (that is, even if the deformable conductor did not need to obey the equation of capillarity,—for example, if it consisted of an elastic conducting solid that would deform onto the dielectric-covered electrode under a virtual displacement of one surface).

This principle of operation of CFA is analogous to how attractive forces are generated in conventional electrostatic actuators where a virtual displacement of one electrode toward another results in a decrease in overall energy. In that case, however, it is achieved through a decrease in the thickness of the dielectric (air), while in the case of the present invention, it is achieved through an increase in the effective area of the dielectric layer. Therefore, in CFA, the thickness of the dielectric used is independent of the distance between the surfaces, unlike in parallel plate electrostatic actuators. Hence, the dielectric thickness may be made very small in capillary force actuators without affecting device stroke, increasing the force produced at a given applied voltage and thus attaining much larger forces and strokes than possible with electrostatic actuators. Furthermore, the dielectric layer in CFA can have a much higher dielectric constant than air, also increasing the amount of force that may be achieved with a given voltage.

It should be appreciated that a wide variety of materials may be utilized to construct the present invention. For example, the dielectric layer may be chosen so as to have high dielectric constant. In one embodiment, the actuator may be constructed with a dielectric layer with a constant 30 times that of air. The layer might be manufactured as thin as practically realizable, preferably less than 500 nm, while maintaining its high resistance and avoiding dielectric breakdown. In another embodiment of the present invention, barium strontium titanate (BST) with a relative dielectric constant of 180 may be deposited on a silicon wafer (covered first with titanium and platinum) with submicron thickness via metal-organic chemical vapor deposition. An alternative embodiment for soft polymeric devices could be a composite of barium titanate nanoparticles mixed into a polymer precursor and cured to form a polymer matrix composite. Suitable polymers for such devices would be polyurethanes and poly-dimethylsiloxane (PDMS). In this case, micron thickness layers may be achieved via spin coating, molding, or casting knife treatment, followed by curing.

In another embodiment of the present invention, the liquid of the capillary bridge can be chosen to have a significantly higher conductivity than the dielectric layer so that the voltage difference across the dielectric layer is as high as possible. Furthermore, the liquid may have a large interfacial surface tension (greater than 45 mN/m) with the non-working fluid (typically a gas, such as air) so as to increase the force capability of the device. The liquid may be chosen such that it does not penetrate, swell, or otherwise react with the electrode, dielectric, or other surfaces. The liquid may also be chosen such that it will not evaporate during device use. Various embodiments include, but are not limited to, the use of mercury, methylene diiodide, formamide, gallium-indium-tin alloy, and water for the liquid bridge.

In another embodiment, the wetting surfaces of the device are lyophobic to the liquid used when no voltage is applied. This allows a substantial change in contact angle and, hence, a substantial change in the capillary force applied. Furthermore, lyophobicity allows the actuator to apply both repulsive and attractive forces dependent on the applied voltage. If the dielectric layer used is lyophilic, a very thin (i.e., several nanometers) coating of lyophobic material, such as the polymers poly-tetrafluoroethelyne (PTFE) or poly-dimethylsiloxane (PDMS), may be used, with PTFE being the optimal choice. Better functioning of the device is generally obtained when there is little contact angle hysteresis on the surface and such coatings may be useful in this regard also. Appropriate microscale surface texturing is useful in decreasing contact angle hysteresis and rendering the surface super-lyophobic [Chen 1999]. Such surface texturing may be achieved via molding or roughening.

In another embodiment, the diameter of the liquid bridge may be significantly greater than the distance it spans (a factor of 10 to 50) between the two surfaces. When a cavity is employed, a lower value of this ratio may be used, greater than 3 is recommended.

As stated, the force generation capability of the device may be understood from the principle of virtual work. This viewpoint dictates that it is desirable to enhance the increase in wetted dielectric surface with a displacement of one surface toward the other. Toward this end, an embodiment of the current invention includes cavities in the surface(s) into which the liquid bridge will wet with displacement of the surfaces. This geometry is shown in FIGS. 4 and 5, and discussed above. Another means to achieve this enhancement is to increase the dielectric layer area per unit wetted area by manufacturing the dielectric layer to have a special "folded" geometry. An embodiment of the invention might also mimic the geometry of the electrostatic comb actuators and is shown in FIG. 7. In this case, microscale fins 151, analogous to comb teeth, project from the electrodes and are coated with a thin layer of material with high dielectric constant 41. Embedded within this material are conducting "fingers" 161 that may be exposed to the liquid bridge 50 at one end and are interdigitated with the fins but separated from them and from each other by the dielectric material. These fingers do not touch one another. As the liquid bridge contact line 60 advances over a surface of this construction, it contacts these fingers (or a very thin layer upon them) and brings an area of dielectric gap between the fingers and fins into the circuit, this area of dielectric exposed to the potential difference being significantly greater than increase in wetted area. Hence, the force produced would be significantly greater under the same applied voltage than that achieved with the conventional design of a planar dielectric layer. Many geometric arrangements of electrode fins and fingers are possible. For example, a cavity may be used with its electrodes having a "folded" dielectric layer, greatly improving the force-voltage characteristic of the device.

Figure 8B:
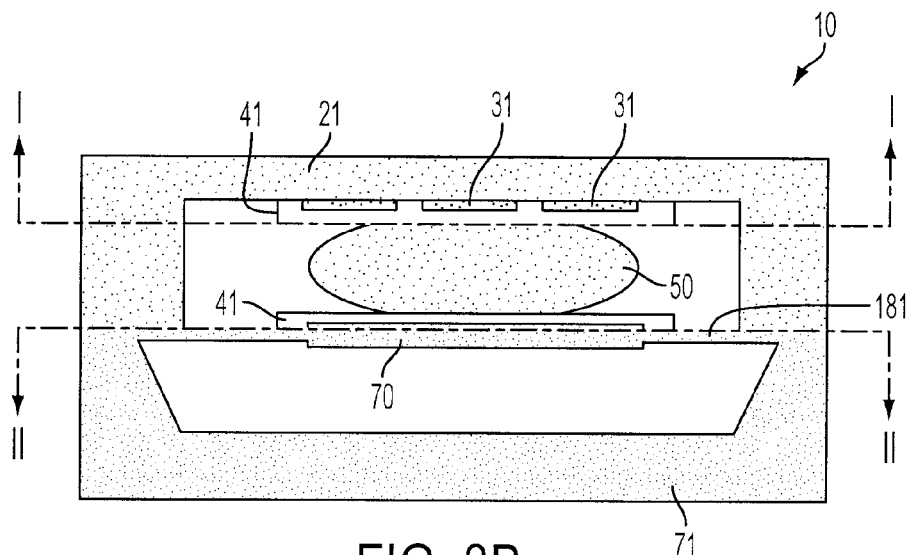
FIG. 8(B) provides a cross-sectional view of a Capillary Force Actuator that comprises a substrate and that includes flexible supports capable of providing an opposing force to the electrostatic and electrowetting effects.
Figure 8C:
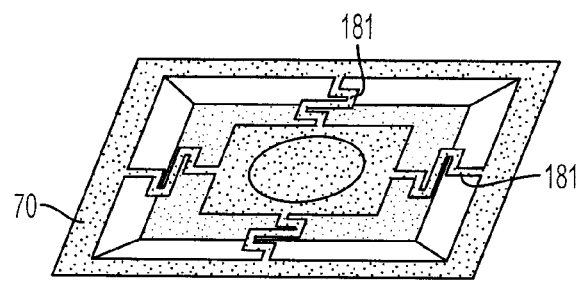
FIG. 8(C) provides a schematic elevated top-view of a cross section of Capillary Force Actuator along cross-section II-II of FIG. 8.

Various embodiments of the invention and its parts may be manufactured by several different methods depending on the ultimate application and types of materials desired. For application in conventional silicon MEMS, industry-standard lithographic fabrication may be employed. An embodiment of this kind is illustrated in FIG. 8B which combines a micromachined silicon component (FIG. 8C) with micromachined glass (FIG. 8A) to form the actuator. This particular embodiment contains concentric electrodes 31 to form one active surface 21, opposite a passive dielectric-surface 70 held by flexible supports 181 and connected to a base 71. For application in Bio-MEMS, lithographic fabrication may be combined with micromolding of polymeric structures and assembly.

The invention and the embodiments described above provide a number of significant advantages over the prior art. This principle of operation of CFA is analogous to how attractive forces are generated in conventional parallel plate electrostatic actuators where a virtual displacement of one electrode toward another results in a decrease in overall energy. In that case, however, it is achieved through a decrease in the thickness of the dielectric (air), while in the case of the present invention, it is achieved through an increase in the effective area of the dielectric layer. Therefore, in CFA, the thickness of the dielectric used is independent of the distance between the surfaces, unlike in parallel plate electrostatic actuators. Hence, the dielectric thickness may be made very small in capillary force actuators without affecting device stroke, increasing the force produced at a given applied voltage and thus attaining much larger forces than possible with electrostatic actuators. Furthermore, the dielectric layer in CFA can have a much higher dielectric constant than air, also increasing the amount of force that may be achieved with a given voltage.

The capillary force actuator has several significant advantages in comparison to other technologies: The force capability is much greater (10-100 times) than that of a similarly sized electrostatic actuator when voltage levels used are restricted to those commonly employed in integrated circuits; The total movement allowable is greater than that typically achieved with electrostatic or piezoelectric actuators employed in MEMS; Out-of-plane forces can be easily achieved. Many optical and microfluidic applications require forces normal to the device plane, however, this is difficult to achieve with electrostatic actuators that have significant force capability; and no mechanical wear occurs unlike in some MEMS actuation technologies, such as scratch actuators.

Of course, it should be understood that a wide range of changes and modifications could be made to the preferred embodiments described above. It is therefore intended that the foregoing detailed description be considered in all respects illustrative rather than limiting the invention described herein. The scope of the invention is thus indicated by the following claims, including all equivalents.

References

The devices, systems and methods of various embodiments of the invention disclosed herein may utilize aspects disclosed in the following references and patents and which are hereby incorporated by reference herein in their entirety:

Patents:

| | | | |
|---|---|---|---|
| 6,152,181 | November 2000 | Phillip G. Wapner, et al. | 137/807 |
| 6,565,727 | May 2003 | Alexander D. Shenderov | 204/600 |
| 6,545,815 | April 2003 | Timofei N. Kroupenkine, et al. | 359/665 |
| 5,472,577 | December 1995 | Marc D. Porter, et al. | 204/111 |
| 6,911,132 | June 2005 | Vamsee K. Pamula, et al. | 204/600 |
| 6,458,256 | October 2002 | Chuan-Jian Zhong | 204/242 |
| 6,629,826 | October 2003 | Euisik Yoon, et al. | 417/393 |
| 6,989,234 | January 2006 | Pramod Kolar, et al. | 435/6 |
| 6,133,670 | October 2000 | M. Steven Rodgers, et al. | 310/309 |

Other:

[Moon 2002] H. Moon, S. K. Cho, R. Garrell, C.-J. Kim, "Low Voltage Electrowetting-On-Dielectric," Journal of Applied Physics, Vol. 92, No. 7, October 2002, pp. 4080-4087.

[Jackel 1983] J. L. Jackel, S. Hackwood, J. J. Veselka, and G. Beni, "Electrowetting Switch for Multimode Optical Fibers," Applied Optics, Vol. 22, No. 11, June 1983, pp. 1765-1770.

[Shapiro 2003] B. Shapiro, H. Moon, R. Garrell, C.-J. Kim, "Equilibrium Behavior of Sessile Drops under Surface Tension, Applied External Fields, and Material Variations," Journal of Applied Physics, Vol. 93, No. 9, May 2003, pp 5794-5811.

[Pollack 2002] M. G. Pollack, A. D. Shenderov, and R. B. Fair, "Electrowetting-based Actuation of Droplets for Integrated Microfluidics," Lab on a Chip, Vol. 2, 2002, pp. 96-101.

[Chen 1999] W. Chen, A. Fadeev, M. Hsieh, D. Oner, J. Youngblood, and T. McCarthy, "Ultrahydrophobic and Ultralyophobic Surfaces: Some Comments and Examples," Langmuir, Vol. 15, 1999, pp. 3395-3399.

[Wan 2006] Z. Wan, "Surface Tension Modulation for Actuation of Microdevices," http://www.ece.uic.edu/~zlwan/research.htm

[TI 2006] "DLP Technology," http://www.dlp.com/dlp_technology/default.asp

In summary, while the present invention has been described with respect to specific embodiments, many modifications, variations, alterations, substitutions, and equivalents will be apparent to those skilled in the art. The present invention is not to be limited in scope by the specific embodiment described herein. Indeed, various modifications of the present invention, in addition to those described herein, will be apparent to those of skill in the art from the foregoing description and accompanying drawings. Accordingly, the invention is to be considered as limited only by the spirit and scope of the following claims, including all modifications and equivalents.

Still other embodiments will become readily apparent to those skilled in this art from reading the above-recited detailed description and drawings of certain exemplary embodiments. It should be understood that numerous variations, modifications, and additional embodiments are possible, and accordingly, all such variations, modifications, and embodiments are to be regarded as being within the spirit and scope of this application. For example, regardless of the content of any portion (e.g., title, field, background, summary, abstract, drawing figure, etc.) of this application, unless clearly specified to the contrary, there is no requirement for the inclusion in any claim herein or of any application claiming priority hereto of any particular described or illustrated activity or element, any particular sequence of such activities, or any particular interrelationship of such elements. Moreover, any activity can be repeated, any activity can be performed by multiple entities, and/or any element can be duplicated. Further, any activity or element can be excluded, the sequence of activities can vary, and/or the interrelationship of elements can vary. Unless clearly specified to the contrary, there is no requirement for any particular described or illustrated activity or element, any particular sequence or such activities, any particular size, speed, material, dimension or frequency, or any particularly interrelationship of such elements. Accordingly, the descriptions and drawings are to be regarded as illustrative in nature, and not as restrictive. Moreover, when any number or range is described herein, unless clearly stated otherwise, that number or range is approximate. When any range is described herein, unless clearly stated otherwise, that range includes all values therein and all sub ranges therein. Any information in any material (e.g., a United States/foreign patent, United States/foreign patent application, book, article, etc.) that has been incorporated by reference herein, is only incorporated by reference to the extent that no conflict exists between such information and the other statements and drawings set forth herein. In the event of such conflict, including a conflict that would render invalid any claim herein or seeking priority hereto, then any such conflicting information in such incorporated by reference material is specifically not incorporated by reference herein.

What is claimed is:

1. A capillary force-actuator, said actuator comprising:
    a first substrate;
    an electrode layer disposed on said first substrate;
    a dielectric layer disposed on said electrode layer on the side farthest from said first substrate;
    a second substrate;
    a conducting liquid in communication with said dielectric layer of said first substrate and said second substrate, whereby the capillary pressure within said liquid is reduced by the application of an electric potential and is below ambient pressure with the application of sufficient electrical potential thereby exerting a pulling force on said first and second substrates;
    an electrode layer disposed on said second substrate on side of substrate nearest to said conducting liquid;
    a dielectric layer disposed between said electrode layer on side of said electrode layer nearest to said conducting liquid;
    a third substrate in communication with said conducting liquid; and
    whereby said reduction in capillary pressure thereby exerts a force on said third substrate.

2. The actuator of claim 1, wherein said third substrate comprises a plate.

3. The actuator of claim 1, wherein said third substrate comprises a flexible surface, diaphragm, or membrane.

4. The actuator of claim 1, wherein at least one of said substrates covered by the dielectric layer contains a cavity into which said liquid bridge may enter; whereby said electrode layer is distributed over the surface area of said cavity and covered by said dielectric layer of high permittivity.

5. The actuator of claim 1, wherein said third substrate comprises topological features.

6. The actuator of claim 1, wherein said third substrate comprises chemical heterogeneity.

7. A capillary force actuator, said actuator comprising:
    a first substrate;
    an electrode layer disposed on said first substrate;
    a dielectric layer disposed on said electrode layer on the side farthest from said first substrate;
    a second substrate;
    a conducting liquid in communication with said dielectric layer of said first substrate and said second substrate, whereby the capillar pressure within said liquid is reduced by the application of an electric potential and is below ambient pressure with the application of sufficient electrical potential thereby exerting a pulling force on said first and second substrates;
    an electrode layer disposed on said second substrate on side of substrate nearest to said conducting liquid; and
    a third substrate in communication with said conducting liquid, whereby said reduction in capillary pressure thereby exerts a force on said third substrate.

8. The actuator of claim 7, wherein said third substrate comprises a pate.

9. The actuator of claim 7, wherein said third substrate is a flexible surface, diaphragm, or membrane.

10. A capillary force-actuator, said actuator comprising:
    a first substrate;
    an electrode layer disposed on said first substrate;
    a dielectric layer disposed on said electrode layer on the side farthest from said first substrate;
    a second substrate;
    a conducting liquid in communication with said dielectric layer of said first substrate and said second substrate, whereby the capillary pressure within said liquid is reduced by the application of an electric potential and is below ambient pressure with the application of sufficient electrical potential thereby exerting a pulling force on said first and second substrates:
    additional electrodes and/or metal layers disposed on:
    said first substrate and said second substrate; and
    whereby said additional electrodes and/or metal layers are not in communication with said conducting liquid and said additional electrodes and/or metal layers are positioned opposite each other on:
    said first substrate and said second substrate.

11. The actuator of claim 10,
wherein said additional electrodes and/or metal layers are arranged in a circularly symmetric arrangement.

12. The actuator of claim 10, further comprising:
    a dielectric layer disposed on said additional electrodes and/or metal layers on side furthest from said respective substrate, and wherein said additional electrodes and/or metal layers are capable of coming into close proximity or contact with each other with an applied electric potential without coming into communication with the said conductive liquid.

13. A capillary force-actuator, said actuator comprising:
a first substrate;
an electrode layer disposed on said first substrate;
a dielectric layer disposed on said electrode layer on the side farthest from said first substrate;
a second substrate;
a conducting liquid in communication with said dielectric layer of said first substrate and said second substrate, whereby the capillary pressure within said liquid is reduced by the application of an electric potential and is below ambient pressure with the application of sufficient electrical potential thereby exerting a pulling force on said first and second substrates;
an electrode layer disposed on said second substrate on side of substrate nearest to said conducting liquid;
a dielectric layer disposed between said electrode layer on side of said electrode layer nearest to said conducting liquid;
additional electrodes and/or metal layers disposed on:
said first substrate and said second substrate; and
whereby said additional electrodes and/or metal layers are not in communication with said conducting liquid and said additional electrodes and/or metal layers are positioned opposite each other on:
said first substrate and said second substrate.

14. The actuator of claim 13, wherein said additional electrodes and/or metal layers are arranged in a circularly symmetric arrangement.

15. The actuator of claim 13, further comprising:
a dielectric layer disposed on said additional electrodes and/or metal layers on side furthest from said respective substrate, and
wherein said additional electrodes and/or metal layers are capable of coming into close proximity or contact with each other with an applied electric potential without coming into communication with the said conductive liquid.

16. A capillary force-actuator, said actuator comprising:
a first substrate;
an electrode layer disposed on said first substrate;
a dielectric layer disposed on said electrode layer on the side farthest from said first substrate;
a second substrate;
a conducting liquid in communication with said dielectric layer of said first substrate and said second substrate, whereby the capillary pressure within said liquid is reduced by the application of an electric potential and is below ambient pressure with the application of sufficient electrical potential thereby exerting a pulling force on said first and second substrates;
an electrode layer disposed on said second substrate on side of substrate nearest to said conducting liquid;
additional electrodes and/or metal layers disposed on:
said first substrate and said second substrate; and
whereby said additional electrodes and/or metal layers are not in communication with said conducting liquid and said additional electrodes and/or metal layers are positioned opposite each other on:
said first substrate and said second substrates.

17. The actuator of claim 16, wherein said additional electrodes and/or metal layers are arranged in a circularly symmetric arrangement.

18. The actuator of claim 16, further comprising:
a dielectric layer disposed on said additional electrodes and/or metal layers on side furthest from said respective substrate, and
wherein said additional electrodes and/or metal layers are capable of coming into close proximity or contact with each other with an applied electric potential without corning into communication with the said conductive liquid.

19. A capillary force-actuator, said actuator comprising:
a first substrate;
an electrode layer disposed on said first substrate;
a dielectric layer disposed on said electrode layer on the side farthest from said first substrate;
a second substrate;
a conducting liquid in communication with said dielectric layer of said first substrate and said second substrate, whereby the capillary pressure within said conducting liquid is reduced by the application of an electric potential and is below ambient pressure with the application of sufficient electrical potential thereby exerting a pulling force on said first and second substrates; and
wherein at least one of said substrates contains a cavity into which said liquid bridge may enter; and whereby said electrode layer is distributed over the surface area of said cavity and covered by said dielectric layer.

20. A capillary force-actuator, said actuator comprising:
a first substrate;
an electrode layer disposed on said first substrate;
a dielectric layer disposed on said electrode layer on the side farthest from said first substrate;
a second substrate;
a conducting liquid in communication with said dielectric layer of said first substrate and said second substrate, whereby the capillary pressure within said conducting liquid is reduced by the application of an electric potential and is below ambient pressure with the application of sufficient electrical potential thereby exerting a pulling force on said first and second substrates;
wherein the ambient environment of said conducting liquid is a less-conductive non-working fluid than said conducting liquid; and
wherein at least one of said substrates contains a cavity into which said liquid bridge may enter, whereby said electrode layer is distributed over the surface area of said cavity and covered by said dielectric layer.

21. A capillary force-actuator, said actuator comprising:
a first substrate;
an electrode layer disposed on said first substrate;
a dielectric layer disposed on said electrode layer on the side farthest from said first substrate;
a second substrate;
a conducting liquid in communication with said dielectric layer of said first substrate and said second substrate, whereby the capillary pressure within said conducting liquid is reduced by the application of an electric potential and is below ambient pressure with the application of sufficient electrical potential thereby exerting a pulling force on said first and second substrates;
wherein the ambient environment of said conducting liquid is a less-conductive non-working fluid than said conducting liquid; and
wherein at least one of said substrates contains a cavity into which said liquid bridge may enter, whereby said electrode layer is distributed over the surface area of said cavity and covered by said dielectric layer.

22. A capillary force-actuator, said actuator comprising:
a first substrate;
an electrode layer disposed on said first substrate;
a dielectric layer disposed on said electrode layer on the side farthest from said first substrate;
a second substrate;
a conducting liquid in communication with said dielectric layer of said first substrate and said second substrate, whereby the capillary pressure within said conducting liquid is reduced by the application of an electric potential and is below ambient pressure with the application of sufficient electrical potential thereby exerting a pulling force on said first and second substrates;
an electrode layer disposed on said second substrate on side of substrate nearest to said conducting liquid;
a dielectric layer disposed between said electrode layer on side of said electrode layer nearest to said conducting liquid; and
wherein at least one of said substrates covered by the dielectric layer contains a cavity into which said liquid bridge may enter; whereby said electrode layer is distributed over the surface area of said cavity and covered by said dielectric layer.

23. A capillary force-actuator, said actuator comprising:
a first substrate;
an electrode layer disposed on said first substrate;
a dielectric layer disposed on said electrode layer on the side farthest from said first substrate;
a second substrate;
a conducting liquid in communication with said dielectric layer of said first substrate and said second substrate, whereby the capillary pressure within said conducting liquid is reduced by the application of an electric potential and is below ambient pressure with the application of sufficient electrical potential thereby exerting a pulling force on said first and second substrates;
an electrode layer disposed on said second substrate on side of substrate nearest to said conducting liquid;
a dielectric layer disposed between said electrode layer on side of said electrode layer nearest to said conducting liquid;
wherein the ambient environment of said conducting liquid is a less-conductive non-working fluid than said conducting liquid; and
wherein at least one of said substrates covered by the dielectric layer contains a cavity into which said liquid bridge may enter; whereby said electrode layer is distributed over the surface area of said cavity and covered by said dielectric layer of high permittivity.

24. A capillary force-actuator, said actuator comprising:
a first substrate;
an electrode layer disposed on said first substrate;
a dielectric layer disposed on said electrode layer on the side farthest from said first substrate;
a second substrate;
a conducting liquid in communication with said dielectric layer of said first substrate and said second substrate, whereby the capillary pressure within said conducting liquid is reduced by the application of an electric potential and is below ambient pressure with the application of sufficient electrical potential thereby exerting a pulling force on said first and second substrates;
an electrode layer disposed on said second substrate on side of substrate nearest to said conducting liquid;
a dielectric layer disposed between said electrode layer on side of said electrode layer nearest to said conducting liquid;
a flexible support in communication with at least one of said substrates, whereby said flexible support provides at least one additional force to said first substrate or said second substrate or both said first substrate and said second substrate;
wherein the ambient environment of said conducting liquid is a less-conductive non-working fluid than said conducting liquid; and
wherein at least one of said substrates covered by the dielectric layer contains a cavity into which said liquid bridge may enter; whereby said electrode layer is distributed over the surface area of said cavity and covered by said dielectric layer of high permittivity.

25. A capillary force-actuator, said actuator comprising:
a first substrate;
an electrode layer disposed on said first substrate;
a dielectric layer disposed on said electrode layer on the side farthest from said first substrate;
a second substrate;
a conducting liquid in communication with said dielectric layer of said first substrate and said second substrate, whereby the capillary pressure within said conducting liquid is reduced by the application of an electric potential and is below ambient pressure with the application of sufficient electrical potential thereby exerting a pulling force on said first and second substrates;
an electrode layer disposed on said second substrate on side of substrate nearest to said conducting liquid; and
wherein at least one of said substrates covered by the dielectric layer contains a cavity into which said liquid bridge may enter; whereby said electrode layer is distributed over the surface area of said cavity and covered by said dielectric layer.

26. A capillary force-actuator, said actuator comprising:
a first substrate;
an electrode layer disposed on said first substrate;
a dielectric layer disposed on said electrode layer on the side farthest from said first substrate;
a second substrate;
a conducting liquid in communication with said dielectric layer of said first substrate and said second substrate, whereby the capillary pressure within said conducting liquid is reduced by the application of an electric potential and is below ambient pressure with the application of sufficient electrical potential thereby exerting a pulling force on said first and second substrates;
an electrode layer disposed on said second substrate on side of substrate nearest to said conducting liquid;
wherein the ambient environment of said conducting liquid is a less-conductive non-working fluid than said conducting liquid; and
wherein at least one of said substrates covered by the dielectric layer contains a cavity into which said liquid bridge may enter; whereby said electrode layer is distributed over the surface area of said cavity and covered by said dielectric layer of high permittivity.

27. A capillary force-actuator, said actuator comprising:
a first substrate;
an electrode layer disposed on said first substrate;
a dielectric layer disposed on said electrode layer on the side farthest from said first substrate;
a second substrate;
a conducting liquid in communication with said dielectric layer of said first substrate and said second substrate, whereby the capillary pressure within said conducting liquid is reduced by the application of an electric potential and is below ambient pressure with the application of sufficient electrical potential thereby exerting a pulling force on said first and second substrates;

an electrode layer disposed on said second substrate on side of substrate nearest to said conducting liquid;

a flexible support in communication with at least one of said substrates, whereby said flexible support provides at least one additional force to said first substrate or said second substrate or both said first substrate and said second substrate;

wherein the ambient environment of said conducting liquid is a less-conductive non-working fluid than said conducting liquid; and wherein at least one of said substrates covered by the dielectric layer contains a cavity into which said liquid bridge may enter; whereby said electrode layer is distributed over the surface area of said cavity and covered by said dielectric layer of high permittivity.

\* \* \* \* \*